(12) United States Patent
Blick et al.

(10) Patent No.: US 12,298,448 B2
(45) Date of Patent: May 13, 2025

(54) MICROCHANNEL SENSOR AND METHOD OF MANUFACTURING THE SAME

(71) Applicant: UNIVERSITÄT HAMBURG, Hamburg (DE)

(72) Inventors: Robert Blick, Hamburg (DE); Stefanie Haugg, Hamburg (DE); Robert Zierold, Hamburg (DE)

(73) Assignee: UNIVERSITÄT HAMBURG, Hamburg (DE)

( * ) Notice: Subject to any disclaimer, the term of this patent is extended or adjusted under 35 U.S.C. 154(b) by 267 days.

(21) Appl. No.: 17/916,165

(22) PCT Filed: Mar. 30, 2021

(86) PCT No.: PCT/EP2021/058278
§ 371 (c)(1),
(2) Date: Sep. 30, 2022

(87) PCT Pub. No.: WO2021/198248
PCT Pub. Date: Oct. 7, 2021

(65) Prior Publication Data
US 2023/0152473 A1    May 18, 2023

(30) Foreign Application Priority Data

Mar. 31, 2020   (LU) .................................. 101723

(51) Int. Cl.
*H01J 43/24*         (2006.01)
*B29C 64/124*     (2017.01)
(Continued)

(52) U.S. Cl.
CPC .............. *G01T 1/16* (2013.01); *B29C 64/124* (2017.08); *B33Y 10/00* (2014.12); *B33Y 80/00* (2014.12);
(Continued)

(58) Field of Classification Search
CPC ..... B29C 64/124; B29C 64/129; B33Y 10/00; B33Y 80/00; G01T 1/16; H01J 43/24;
(Continued)

(56) References Cited

U.S. PATENT DOCUMENTS 5,086,248 A  *  2/1992  Horton .................... H01J 9/12
                                                                313/105 CM
2005/0122020 A1   6/2005   Peck
(Continued)

FOREIGN PATENT DOCUMENTS

| EP | 0 413 481 B1 | 10/1994 |
| WO | 2009/075970 A1 | 6/2009 |
| WO | 2018/060617 A1 | 4/2018 |

*Primary Examiner* — Jurie Yun
(74) *Attorney, Agent, or Firm* — Seed IP Law Group LLP

(57) ABSTRACT

A microchannel sensor for detecting radiation and/or particles, the microchannel sensor comprising at least one sensor substrate, wherein said sensor substrate comprises a plurality of channels extending from a first side of the substrate to an opposite side of the substrate, wherein said channels are arranged along a channel axis which is tilted relative a normal axis of said substrate, and wherein said plurality of channels comprise a first set of channels with a first cross section and a second set of channels with a second cross section being different from said first cross section.

14 Claims, 4 Drawing Sheets

(51) Int. Cl.
   *B33Y 10/00*   (2015.01)
   *B33Y 80/00*   (2015.01)
   *G01T 1/16*    (2006.01)
   *H01J 9/02*    (2006.01)
   *B29L 31/40*   (2006.01)

(52) U.S. Cl.
   CPC .............. *H01J 9/02* (2013.01); *H01J 43/246* (2013.01); *B29L 2031/40* (2013.01)

(58) Field of Classification Search
   CPC .. H01J 43/246; H01J 9/02; H01J 9/125; H01J 1/32; G03F 7/0037; G03F 7/2053; B29L 2031/40
   See application file for complete search history.

(56) References Cited

U.S. PATENT DOCUMENTS

2017/0368704 A1   12/2017   Gester et al.
2019/0096623 A1   3/2019    Wagner et al.

\* cited by examiner

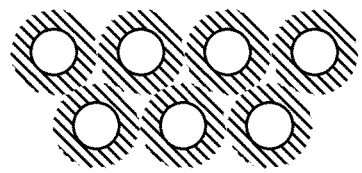
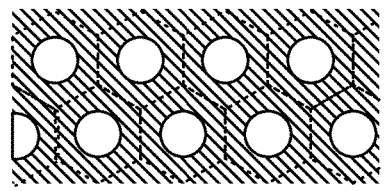
Fig. 4A  Fig. 4B
 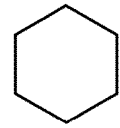 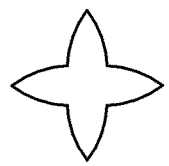 
Fig. 5A   Fig. 5B   Fig. 5C   Fig. 5D
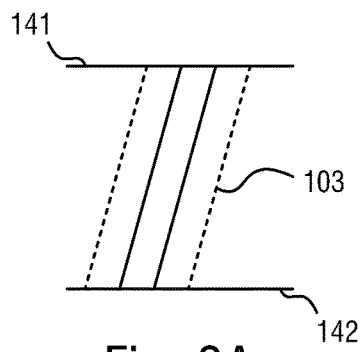 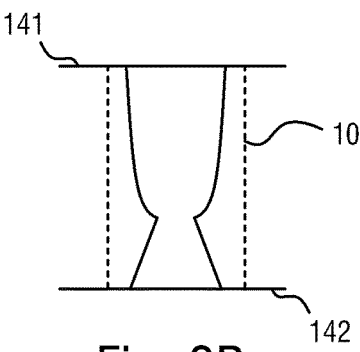 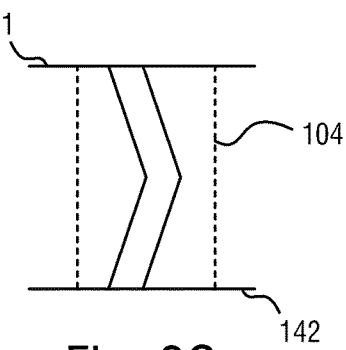
Fig. 6A   Fig. 6B   Fig. 6C
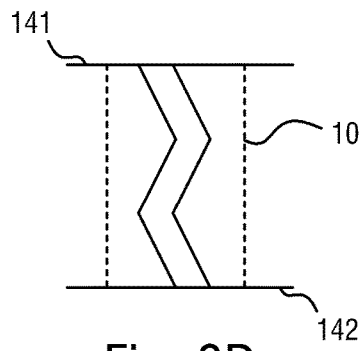 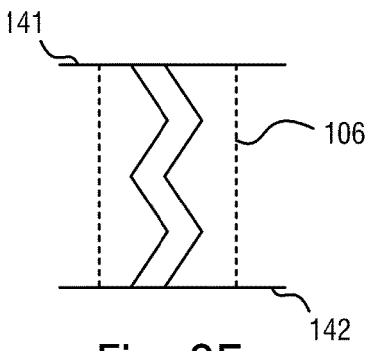 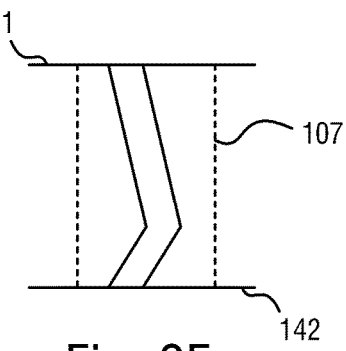
Fig. 6D   Fig. 6E   Fig. 6F

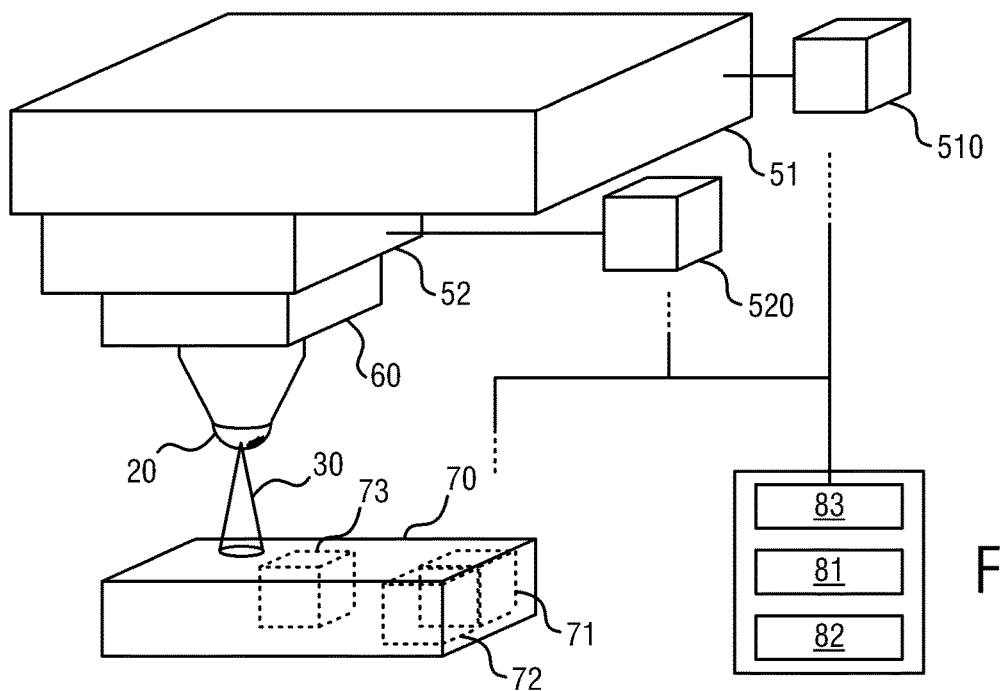
Fig. 10A
Fig. 10B
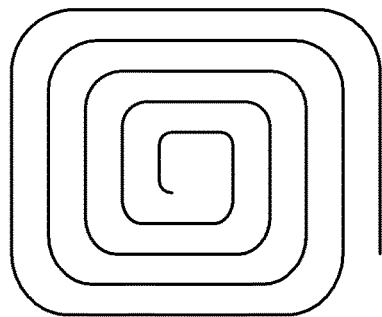
Fig. 11A
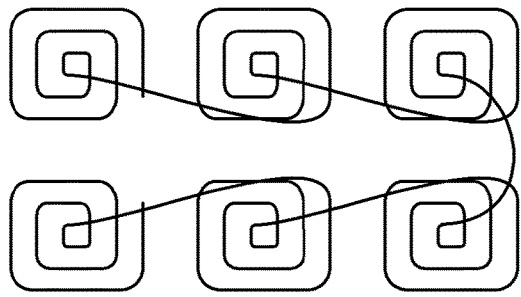
Fig. 11B

MICROCHANNEL SENSOR AND METHOD OF MANUFACTURING THE SAME

TECHNICAL FIELD

The present invention relates to microchannel sensors for radiation and/or particles. In an exemplary form, such a sensor is a so-called microchannel plate (MCP) that comprises a plurality of microchannels extending from one side of the plate to the other. The present invention also relates to configuring, adjusting, selecting, and tuning the specific response characteristics of such sensors. The present invention also relates to a method of manufacturing such microchannel sensors.

BACKGROUND

One of the technical marvels of the 1950s is the so-called microchannel plate (MCPs), which was originally conceived as an electron and/or photon multiplier. One of their prime applications is as night-vision goggles, due to an amplification factor of $10^6$ up to $10^7$. Even today such a tremendous amplification is mostly state of the arts. Generally, an MCP can be regarded as a charge multiplier consisting of plates with a diameter of typically 5 cm (2"), a thickness of about 6.35 mm (¼"), and with drilled pores possessing diameters of 6-12 µm. These pores are slightly skewed or inclined with respect to the normal axis of the plate, in order to impose a sufficient scattering cross section for the impinging particles. Once a bias voltage is applied between top and bottom electrodes, the incoming charge (e.g. a single photo-electron) is multiplied in an avalanche effect. In using double-MCP, the so-called "Chevron-configuration", it is possible to generate up to 10/electrons from one incoming particle.

The established fabrication method relies—in a simplified representation—on pressing together glass rods or tubes and then pulling them under heat. In the case of glass rods, these rods are etched out afterwards. After subsequent cutting under an angle and etching, one retrieves a small disc-like plate comprising a plurality of micro pores. Normally, further coating and/or plating procedures apply for the formation of contact electrodes, support structures, and to ensure suitable surface characteristics. During operation, an incident photon excites on an inner wall of the pore one or more electrons, each of which—in turn—excites again one or more electrons on the opposite wall within the pore. Due to the applied electric field, a charge carrier avalanche takes place along the pore. Such conventional microchannel plates usually comprise a plurality of channels with identical or very similar properties, which originates mainly from the limitations inherent to the employed manufacturing techniques.

Although existing microchannel plates provide sensitivity and amplification factors that suffice for most applications, the conventional arts fail to provide a more detailed control of the radiation sensors-especially with regard to flexibility and tunability of the microchannel plate sensors. It is mostly accepted practice that a specific microchannel plate is used—and needs to be (tailor) manufactured accordingly—for one desired application requiring specific spectral and/or intensity responsivities. Such shortcomings can be mostly associated to the limitations of the employed manufacturing techniques.

There is therefore a need for microchannel radiation sensors that offer improved characteristics beyond amplification, the latter being already satisfactory for most applications. Since the design details of micro channel radiation sensors depend on the available manufacturing techniques, there is as well a need for an improved method of manufacturing such microchannel radiation sensors.

SUMMARY

The mentioned problems and drawbacks are addressed by the subject matter of the independent claims. Further preferred embodiments are defined in the dependent claims.

According to one embodiment of the present invention there is provided a microchannel sensor for detecting radiation and/or particles, the microchannel sensor comprising at least one sensor substrate, wherein said sensor substrate comprises a plurality of channels extending from a first side of the substrate to an opposite side of the substrate, wherein said channels are arranged along a channel axis which is tilted relative a normal axis of said substrate, and wherein said plurality of channels comprise a first set of channels with a first cross section and a second set of channels with a second cross section being different from said first cross section.

According to another embodiment of the present invention there is provided a method of manufacturing a sensor substrate for a microchannel sensor by step-wise exposing a voxel of a resist to radiation for forming a three-dimensional structure, the method comprising setting a step size to a first resolution; setting a voxel volume to a first volume; exposing a first set of voxels of said first volume to radiation using said first resolution; setting the step size to a second resolution being smaller than said first resolution, or, respectively, greater than said first resolution; setting the voxel volume to a second volume being smaller than said first volume, or, respectively, greater than said first volume; and exposing a second set of voxels of said second volume to radiation using said second resolution.

BRIEF DESCRIPTION OF THE DRAWINGS

Embodiments of the present invention, which are presented for better understanding the inventive concepts but which are not to be seen as limiting the invention, will now be described with reference to the figures in which:

FIGS. 4A and 4B show schematic views of solid wall parts surrounding hollow channel parts according to embodiments of the present invention;

FIGS. 5A to 5D show schematic top views of hollow channel parts according to embodiments of the present invention;

FIGS. 6A to 6F show schematic lateral views along the channels in a microchannel sensor according to embodiments of the present invention;

FIGS. 10A and 10B shows schematic views of general apparatus embodiments for carrying out methods according to embodiments of the present invention; and FIGS. 11A & 11B show schematic views of a writing path arrangement according to respective embodiments of the present invention.

DETAILED DESCRIPTION

Generally, embodiments of the present invention relate to manufacturing microchannel sensors that comprise channels of different cross sections and corresponding sensors as such. In an embodiment, MCPs as charge amplifiers are manufactured with the technique of 3D-nanoprinting (3DN) in combination with additional processing, such as atomic layer deposition (ALD). Embodiments of the present invention consider the fabrication of using the MCPs 3DN-technique allowing relatively small active element dimensions, precise and flexible surface coating in 3D by ALD, and also comparatively complex mesh structures which can be tailored to the specific application. The mentioned factors may provide an enhanced photon and particle detection efficiency and other advantages that, in turn, lead to many applications.

3DN enables the realization of completely novel structures due to the possibility to build large-scale nano-devices in three dimensions. However, the writing speed is still a limitation when it comes to writing cm-objects with nanometer resolution. However, in applying a specific design and manufacturing methods the total time of fabrication (TOF) can be reduced to practical time scales. This kind of design implies the definition of nanoscale parts only when it is indeed required. For the other components of the target structures, e.g. MCPs, such as the holding frame and interconnects, embodiments of the present invention employ 3DN with a lower resolution, e.g. in the micrometer range. In this way, embodiments of the present invention can reduce the TOF considerably and make the overall process applicable in industry.

While conventional resists for 3D-nanoprinting can be employed (e.g. based on two-photon-polymerization, 2PP, which are typically insulators), the surface properties can be tailor-made and enhanced by making use of, for example, atomic layer deposition (ALD). The self-limiting nature of the gas-solid surface reactions allows for a conformal deposition even in high aspect ratio 3 DN nano-/microstructures as employed in the present sensors. Such a conformal coating of an application-specific material can be in particular useful when it comes to enhancing the charge multiplication process.

Figure 1A:
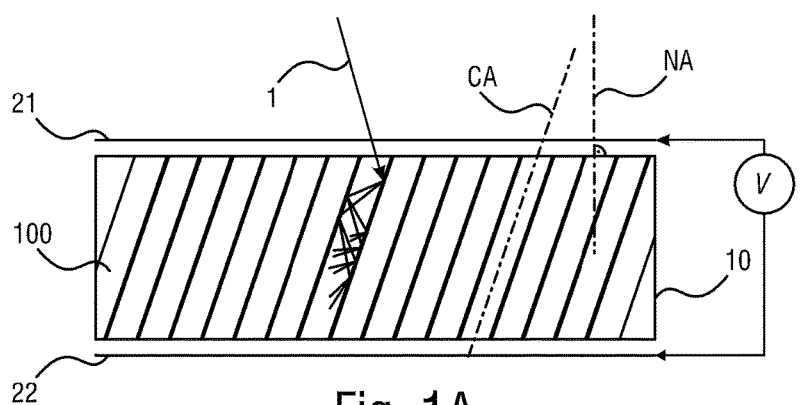
FIGS. 1A and 1B show schematic views of conventional microchannel plates.
Figure 1B:
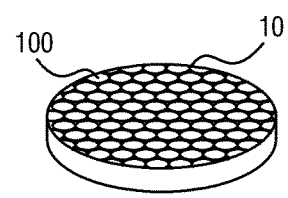

FIGS. 1A and 1B show schematic views of conventional microchannel plates, which are an envisaged starting point application for the embodiments of the present invention. As shown in FIG. 1A, conventional MCPs usually have a fairly simple structure, i.e. cylindrical pores 100 as channels protruding a ring under an angle. The tilting angle can be seen between a substrate normal axis NA and a channel axis CA extending along the main direction of a channel. In this way, the channels 100 form a sensor substrate 10 in the form of a plate. Usually, an external voltage V is applied by means of electrodes 21 and 22. Incident radiation and/or particles 1 can accordingly interact with an inner wall surface of a channel and excite charge carriers in an avalanche fashion and so provide substantial charge multiplication for obtaining excellent sensitivity. FIG. 1B shows a schematic perspective view of a channel plate 10 in which the openings of the individual channels 100 are largely magnified with respect to usual plate dimensions for demonstration purposes.

Figure 2A:
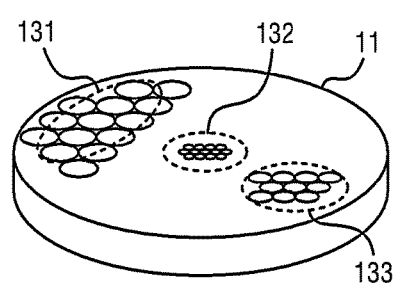
FIGS. 2A to 2D show schematic views of configurations considering different channel cross sections on one microchannel sensor according to embodiments of the present invention.
Figure 2C:
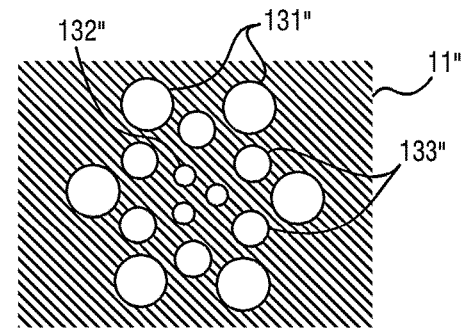
Figure 2B:
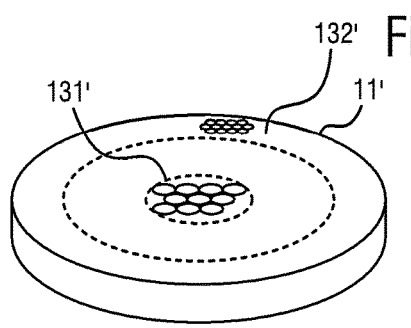

FIGS. 2A, 2B and 2C show schematic views of configurations considering different channel cross sections on one microchannel sensor according to embodiments of the present invention. Accordingly, a microchannel sensor for detecting radiation and/or particles is provided and comprises at least a sensor substrate 11, 11'. The sensor substrate 11, 11' comprises a plurality of channels extending from one side of the substrate to the other and the channels are arranged along a channel axis CA which is tilted relative a normal axis NA of the substrate. The plurality of channels comprises a first set 131, 131' of channels with a first cross section and at least a second set 132, 132' of channels with a second cross section being different from said first cross section. The sensor may further comprise a first electrode and a second electrode, such as a top electrode 21 and a bottom electrode 22 shown in the conventional configuration of FIG. 1A. The substrate 11, 11' can then be arranged between the first electrode and the second electrode, wherein the channels accordingly extend from a side facing said first electrode to a side facing said second electrode.

As regards the distribution of the sets 131, 131', ... of channels with different cross-sections, the embodiments of the present invention envisage various configurations which shall not be limited to the configurations actually shown by the Figures and expressly discussed in the present disclosure. As one exemplary embodiment, FIG. 2A show a sensor substrate 11 in a side/top view with different sets 131, 132, 133 of channels with different cross-sections (not to scale to the substrate diameter for demonstration). A first set 131 may comprise a set of channels with largest cross-section in one continuous zone of the substrate, a second set 132 may comprise a set of channels with smallest cross-section in a further continuous zone of the substrate, and a third set 133 may comprise a set of channels with a cross-section between the largest and smallest cross section in yet one further continuous zone of the substrate. In this configuration, the sets 131, 132, and 133 form separate and continuous zones.

In general, smaller channels and respective cross sections usually result in a better charge multiplication factor due to a higher avalanche effect. Thus, according to one embodiment as shown in FIG. 2B, the substrate 11' comprises a set 131' of channels with relatively large cross sections in a center area of the substrate 11' as well as a set 132' of channels with relatively small cross sections in a rim area of the substrate 11'. This may consider the application in which most particles or most of the radiation hit the center, and the smaller diameter/cross section channels are located on the outskirts, since smaller channels may imply better charge multiplication factor, whereas the inner channel show normal multiplication. For photon detection the different diameters and cross sections may contribute to have photon-wavelengths adjusted amplification. With the possibility that different channel diameters and cross sections can be realized according to the embodiments of the present invention over the whole MCP, further advantages can be obtained: This, for example, in the context of imaging applications, night-vision application (e.g. in the form of goggles), mass spectrometry, and all other applications where imaging is of essence.

As a further exemplary embodiment, FIG. 2C shows a sensor substrate 11" in a top view with different sets 131", 132", 133" of channels with different cross-sections (again not to scale for demonstration). A first set 131" may comprise a set of channels with largest cross-section, a second set 132" may comprise a set of channels with smallest cross-section, and a third set 133" may comprise a set of channels with a cross-section between the largest and smallest cross section. In this configuration, the sets are in a way integrated so that the third set 133" is arranged in a relative center, the second set 132" surrounds that third set 133", and the first set 131" surrounds in turn the second set 132". In an embodiment, a hexagon/triangle (or generally symmetric) arrangement of FIG. 2C may contribute in attaining a broad amplification bandwidth within one MCP, i.e. as mentioned elsewhere in the present disclosure, MCPs are usually chosen and designed for a particular application, e.g. particle kind impinging with a certain energy on the MCPs. Thus, having within a single MCP a possibility to vary the diameters or cross sections of the MCPs enables different detection modes for the same MCP.

Figure 2D:
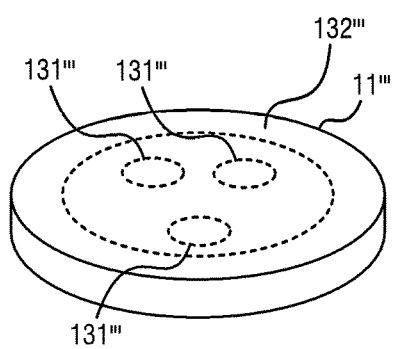

FIG. 2D shows a schematic view of a configuration considering different channel cross sections as well as a sensor part as well as a support part. Specifically, there is shown the sensor substrate 11''' which comprises one or more channel zones 131''', which can comprise sets of channels with different cross sections as this is described in greater detail as part of the respective embodiments in the present disclosure. This embodiment specifically also shows a support part 132''' that surrounds, generally at least in part, the one or more channel zones 131'''. The support part 132''' can be provided for facilitating handling and mounting of a sensor substrate according to an embodiment of the present invention during operation. For example, a support part can be provided for handling, touching and fixing during operation. As the support part 132''' usually comprises less complex features and does usually not require a high resolution during manufacturing, it can be manufactured using a relatively low resolution, while the one or more channel zones 131''' can be manufactured using a relatively high resolution as this is particularly described in greater detail in conjunction with the manufacturing embodiments.

Figure 3A:
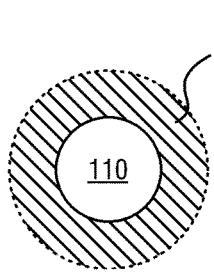
FIGS. 3A to 3C show schematic views of channel cross sections, hollow channel parts and solid wall parts according to embodiments of the present invention.

FIG. 3A shows a schematic view of a channel cross section, a hollow channel part and a corresponding solid wall part according to embodiments of the present invention. Generally, any one of the cross sections mentioned in the present disclosure, may each comprise a hollow channel part 110 and a solid wall part 120 surrounding said hollow channel part 110. The hollow channel part 110 is thus a cross section normal to the respective channel axis and defines the active area in which radiation and/or particles are incident and in which charge excitation and multiplication takes place. More specifically, the circumference of the hollow channel part 110 cross section may define the location at which charge excitation and ejection takes place. This may coincide with the area of an active layer being deposited on the passive support structure of the substrate. The solid wall part 120 that surrounds its said hollow channel part 110 can have a shape and configuration that is similar or related to shape of the hollow channel part 110. It may be, however, only a conceptional part which no direct representation in a physical sensor. Specifically, the solid wall part 120 may be identified as the part of the substrate that can be attributed to one channel, so as to distinguish the area of one channel to the area of another, adjacent channel. In a way, the solid wall part 120 is an area that defines the general density of the channels of one set independent from the size and geometry of the hollow channel part 110.

Figure 3B:
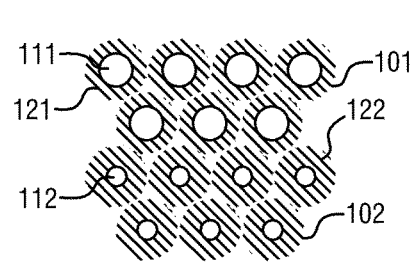
Figure 3C:
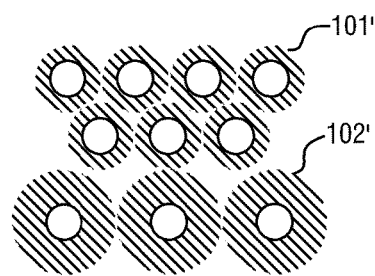

The latter is further shown in conjunction with FIGS. 3B and 3C: Specifically, FIG. 3B shows a configuration in which the channels of different cross section 101, 102 all feature identical (possibly within tolerances) solid wall parts 121, 122, but different hollow channel part 111, 112. In this way the overall density of channels is uniform, bit the cross section in the differ hollow channel part. Conversely, FIG. 3C shows a configuration of cross sections 101', 102' in which the density differs but the hollow channel parts are identical (possibly within tolerances). In another alternative, the cross sections of the respective sets of channels differ in both the hollow channel part as well as solid wall part. As a result, the sensor substrate can be provided with channels of identical or at least similar response characteristics, while obtaining substantial advantage with regard to a mechanical stability of the substrate, and, with this, the entire sensor. For example, the channel density can decrease with increasing distance from a center of the substrate.

FIGS. 4A and 4B show possible definitions of the solid wall parts of a channel cross section. In FIG. 4A, the solid wall parts are defined so that a residual part of the substrate remains that can be of the same and continuous material as of the solid channel walls, of another material or formed as empty space. Conversely, FIG. 4B shows the definition of the solid wall parts to be adjacent to one another and correspondingly fully cover at least a zone of the substrate.

FIGS. 5A to 5D show schematic views of hollow channel parts according to embodiments of the present invention. Specifically, FIG. 5A shows a (substantially) circular cross section shape with possible advantages relating to design, processing and manufacturing simplicity and symmetry. FIG. 5B shows a (substantially) hexagonal cross section shape with possible advantages relating to uniform and continuous coverage and distribution over the substrate. FIGS. 5C and 5D show examples of cross section shape that feature a reduced number of axis symmetries, e.g. only a specific number of axis symmetries or even only one axis symmetry. As shown in FIG. 5C, a star-like, or more specifically a star anise like shape can be provided that has only a limited number of symmetry axes, and the lense-like, or oval shape can be provided that has only two symmetry axes. Especially the latter two embodiments explained in conjunction with FIGS. 5C and 5D may provide advantages relating to obtaining a directional sensitivity of the sensor, since the change in the corresponding wall distance strongly changes the avalanche effect.

FIGS. 6A to 6F show schematic lateral views along the channels in a microchannel sensor according to embodiments of the present invention. Wherein FIG. 6A shows a classical tube like lateral cross section. It is noted that the term 'lateral cross section' is used throughout the present disclosure to specifically refer to cross sections in a plane perpendicular to the main substrate plane (as e.g. shown in FIG. 2C) and in differentiation to the other cross sections mentioned. FIGS. 6B to 6F depict the integration of a so-called Chevron-type, hourglass-type, and other lateral cross sections in one MCP that may provide advantages related to an increased higher amplification factor than conventional, classical geometries (e.g. as seen in FIG. 6A).

The geometries shown in FIGS. 6C-6F can consider that incoming radiation/particles excite 'avalanche electrons' with a different velocity distribution as compared to the original particles. This becomes apparent considering that the 'avalanched' electrons have a much shorter acceleration length within the channel. With such hourglass-type lateral cross section (e.g. as in FIG. 6B), or modified-Chevron type lateral cross sections (e.g. FIG. 6F) designs attributed advantages may include obtaining yet higher amplification factors, since one can adjust the avalanche effect in terms of the electric field distribution inside the micro/nano-channel, which has never been possible in the conventional arts at these dimensions. In a way, a combination of MCP design principles with that of dynodes is obtained. Dynodes usually rely on a narrowing of the channel as shown—for example—in FIG. 6B.

Figure 7:
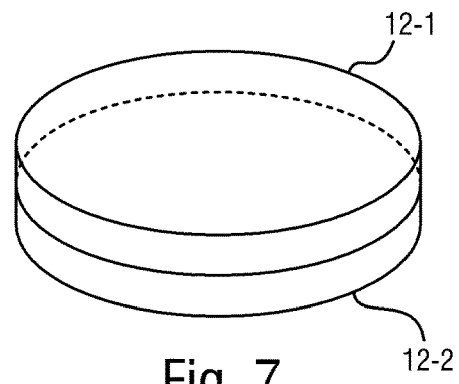
FIG. 7 shows a schematic view of a microchannel sensor according to a further embodiment of the present invention.

FIG. 7 shows a schematic view of a microchannel sensor according to a further embodiment of the present invention. Specifically, this embodiment considers the "sandwiching" of two or more substrates to form a layered sensor substrate. This arrangement may be chosen in the context of manufacturing specific lateral channel cross sections, as those have been described in conjunction with FIGS. 6B to 6F.

As regards the aspects relating to manufacturing of such structures it can be noted that the last decade has witnessed the beginning of the application of three-dimensional (3D) printing on the nanoscale. This has led to a large number of novel findings and applications in a broad range of fields starting with microfluidics over to integrated optics and to bio-physical applications. Similar to the macro- and meso-scale, 3D-nanoprinting (3DN) is currently revolutionizing many industrial fabrication processes. The basis for the 3DN technology was defined by the development of direct laser writing (DLW) tools for lithography in 2D and 2.5D. These tools are mostly used for generating masks for classical 2D optical lithography, but are also employed for sculpting optical micro-lenses for displays with a 2.5D-relief. Recently 3D-printing also was applied to the nanoscale.

An important technical advance was achieved by the application of a quantum mechanical process called two-photon (2P) absorption. This 2P-process is much less likely than the conventional absorption of energy by a material—such as a resist—in a classical exposure process, such as normal photolithography. In order to enhance the likeliness of 2P-processes to occur, one needs to enhance the intensity and the energy of the radiation delivered. With the help of optical lenses with aperture and the development of femto-second lasers it is now possible to make use of two-photon-polymerization, i.e. a 2P-process which polymerizes a resist only when two photons of the same energy are available.

A conventional procedure includes usually first the placing of a resist on a support structure, into which the 3D-geometry is then written in a sequential fashion. During exposure, the most important parameters can be identified in the focus spot size, the writing speed, and the absolute sample size. Finally, it may be important to ensure that the exposed structure maintains its mechanical rigidity during the subsequent development and rinsing processes. It turns out that the last step of delivering the target structure from the resist is usually not trivial, and factors such as how the surface tension and embedded strain interact on the nano- to micro-meter scale. Consequently, 3DN-structures may require a set of special design rules for the target structure having sub-micron features, but having at the same time the necessary mechanical rigidity.

For the above-mentioned reasons, three-dimensional structures with sub-micron features usually require support structures that easily exceed the dimensions of several hundreds of micrometers. Further, there are also target-structures which for themselves possess smaller features, e.g. at the sub-micron scale, and—at the same time—features at a much larger scale that range into the meso-scopic scale. Since, however, the different scale dimensions coexist in one structure, the conventional approaches consider the formation of the target-structure in one procedure.

The conventional arts consider the formation of the larger structures with the same means as are employed for forming the smaller structures, including those at the sub-micron scale. As a result, the necessary exposure and processing times are disadvantageously long, which in turn substantially impede the application of 3DN for high-yield industrial applications, where only a sufficiently high component yield may justify the involved investments. This is similar to the field of modern semiconductor device manufacturing, where only the high degree of scalability and reproducibility allows the manufacturing of powerful devices at a mass-production scale at reasonable costs for the consumers. There is therefore the general need for an improved of way step-wise forming three-dimensional structures at smaller scales that substantially shortens process and exposure times so as to improve yield and allow for device production at larger scales.

According to an embodiment of the present invention there is provided a method of step-wise exposing a voxel of a resist to radiation for forming a three-dimensional structure, the method comprising setting a step size to a first resolution; setting a voxel volume to a first volume; exposing a first set of voxels of said first volume to radiation using said first resolution; setting the step size to a second resolution being smaller than said first resolution, or, respectively, greater than said first resolution; setting the voxel volume to a second volume being smaller than said first volume, or, respectively, greater than said first volume; and exposing a second set of voxels of said second volume to radiation using said second resolution.

In the context of the present disclosure, three-dimensional printing at the nano meter scale may involve the step-wise exposing of nano-scale volumes (so-called voxels) of a photoresist to focused infrared radiation. Depending on the absorbed light, there is no polymerization, useful or target polymerization, and, blistering of respectively, the photoresist. The non-polymerized voxels are removed during developing, whereas the polymerized voxels remain to form the 3DN printed structure. At larger scales, correspondingly larger volumes are step-wise exposed to infrared radiation being focused to the larger target volumes.

Figure 9A:
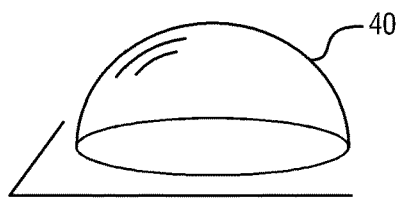
FIGS. 9A to 9D show schematically the formation of a three-dimensional target structure starting from an amount of resist according to an embodiment of the present invention.

FIG. 9A shows a schematic flow chart view of a general method embodiment of the present invention. This embodiment considers the step-wise exposure of voxels of a resist to radiation for forming a three-dimensional structure, as, for example, a microchannel sensor as described in conjunction with the disclosure above. According to this embodiment, the method comprises at least one instance of changing the resolution, involving any one of changing the voxel volume, changing a step-size in any one of three dimensions, changing a focal point volume in which the light intensity fulfils an intensity requirement, changing an optical path of radiation from a radiation source to the focal point volume, changing an emission power of the radiation source, and changing wavelength characteristics of the radiation source. The term 'changing' includes both changing from a smaller resolution to a higher resolution and changing from a higher resolution to a smaller resolution. A relatively small resolution may imply a relatively large voxel volume, a relatively large focal point volume, a relatively large step-size, and/or a relatively high radiation source power, whereas a relatively high resolution may imply a relatively small voxel volume, a relatively small focal point volume, a relatively small step-size, and/or a relatively small radiation source power.

Specifically and as shown in FIG. 9A, the general method embodiment of the present invention comprises a step S110 of setting a step size to a first resolution and a step S120 of setting a voxel volume to a first volume, wherein the mentioned order can be generally reversed or also steps S110 and S120 can be performed in part or substantially at the same time. In one embodiment, the first resolution is relatively high and the corresponding first step size of the first resolution may be in a range of 100 nm to 300 nm, and the first volume of said voxel volume may be in a range of 10,000 nm$^3$ to 2.7×10$^7$ nm$^3$. For this relatively high resolution, a first drive mechanism may be employed for moving and positioning an amount of resist relative to the radiation source or the focal point of that source. This high resolution drive may be a piezo drive, a galvo drive, or a combination there of. However, in another embodiment the method begins with a relatively low resolution. Generally, the terms first resolution and second resolution are not to be seen as limiting with respect to an absolute timely order or type of resolution, i.e. high or low resolution.

If necessary, also other parameters may be chosen and set, such as setting a radiation power to a first power before exposing the first set of voxels, wherein the first power is suitable for exposing voxels at the first resolution which includes the sufficient exposure to radiation energy within the resist so that a target fraction of or substantially the entire target volume of the resist can make a transition from a liquid, viscous, or soluble state to a solid, hardened or non-soluble state. Further, also an optical path of said radiation may be changed, which may include inserting or removing of an optical component into or from the optical path.

The general method embodiment then includes a step S130 of exposing a first set of voxels of said first volume to radiation using said first resolution. In this step, one or more voxels of the first volume are exposed to radiation so as to form a corresponding number of solid, hardened or non-soluble elements of the target structure. This step may involve the driving of the drive selected for this resolution. In particular, a possible sub-sequence may include any one of turning off an exposure of resist to radiation, determining a position, generating drive signals to change the positioning of the resist relative to the focal point of the radiation, turning on an exposure of resist to radiation.

The general method embodiment then includes at least one change of resolution in that in step S140 the step size is set to a second resolution being smaller than said first resolution, or, respectively, greater than said first resolution, and in step S150 the voxel volume is set to a second volume being smaller than said first volume, or, respectively, greater than said first volume. In other words, if the resolution is changed from a high resolution to a low resolution, the step size is set to a second resolution being greater than said first resolution, and the voxel volume is set to a second volume being greater than said first volume. If, however, the resolution is changed from a low resolution to a high resolution, the step size is set to a second resolution being smaller than said first resolution, and the voxel volume is set to a second volume being smaller than said first volume If necessary, also other parameters may be chosen and set, such as setting a radiation power to a second power before exposing the second set of voxels, wherein the second power is suitable for exposing voxels at the second resolution which includes the sufficient exposure to radiation energy within the resist so that a target fraction of or substantially the entire target volume of the resist can make a transition from a liquid, viscous, or soluble state to a solid, hardened or non-soluble state. Further, also an optical path of said radiation may be changed, which may include inserting or removing of an optical component into or from the optical path.

In step S160 a second set of voxels of a second volume is exposed to radiation using said second resolution. In an embodiment the second resolution is relatively low and the corresponding second step size of the second resolution may be in a range of 500 nm to 5 µm, and the second volume of said voxel volume is in a range of 0.125 µm$^3$ to 125 µm$^3$. For this relatively low resolution, a second drive mechanism may be employed for moving and positioning an amount of resist relative to the radiation source or the focal point of that source. This low-resolution drive may be a piezo drive or a step motor drive.

Figure 8A:
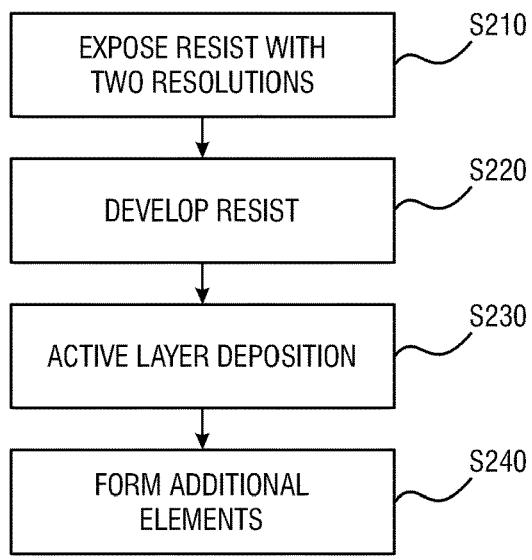
FIGS. 8A and 8B shows schematic flow charts of method embodiments of the present invention.
Figure 8B:
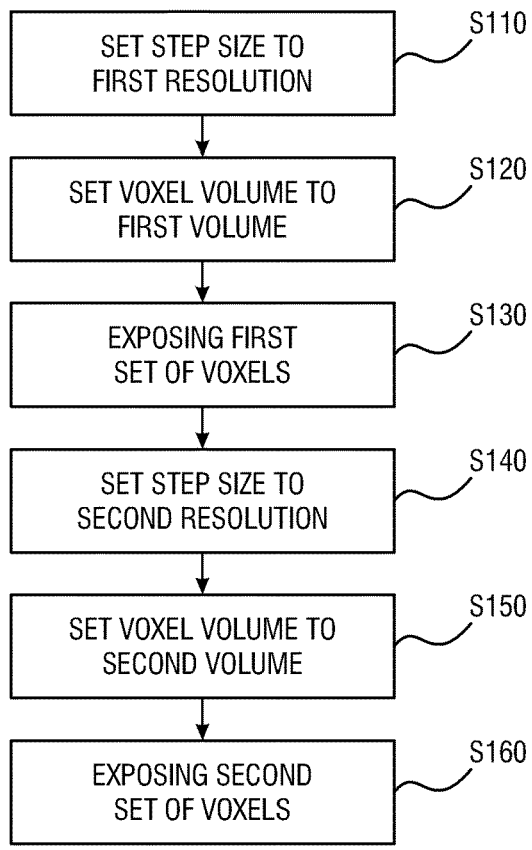

FIG. 8B shows a schematic flow chart view of a further method embodiment of the present invention. Specifically, this embodiment is for manufacturing a microchannel sensor as described in conjunction with the corresponding embodiments of the present disclosure. In a first step, or group of steps, S210 a microchannel sensor substrate is formed by means of exposing a resist with at least two resolutions. This can include at least in part, the entire, or even more than one iteration of the steps as described in conjunction with FIG. 8A. In an embodiment, the sets of channels are formed by employing a relatively high resolution, whereas support and/or intermediate structures are formed by employing a relatively low resolution.

In a subsequent step S220, the exposed resist is developed, so as to obtain the sensor substrate without non-exposed resist or other undesired residual components. In a step S230, an active layer is formed on the inner surface of the hollow channels. This may involve the already mentioned atomic layer deposition (ALD). In a step S240, the top and bottom electrodes are formed and possibly also contacted to a sensor support/chassis, which may include evaporation of one r more electrode material (e.g. a metal such as gold, aluminum, etc.) and may additionally consider evaporation under an angle.

FIGS. 9A to 9D show schematically the formation of a three-dimensional target structure starting from an amount of resist according to an embodiment of the present invention. In this embodiment, the process starts with an amount 40 of a suitable resist residing on a support as shown in FIG. 9A. Although it is shown a droplet 40 of resist on a planar substrate, there may be other configurations, arrangements and orientations. For example, also a configuration may be employed in which a droplet of resist is held from the top (see, for example, FIG. 10A). The resist may be a liquid, viscous or soluble material whose relevant properties may be changed or altered by means of radiation. In one embodiment, a liquid resist is used that can be solidified by exposing a target volume to appropriate radiation.

Figure 9B:
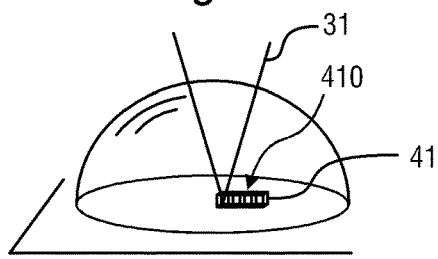

In FIG. 9B, there is shown the exposure of a voxel of a first volume to a first radiation. The finite effective volume of a focal point is adjusted so as to coincide with this first voxel volume 41 of the first resolution. Specifically, the radiation power and focal point distribution is set so as to expose the target volume with sufficient radiation 31 power during a step time so as to reliable transform the resist in this volume from the initial state—e.g. liquid, viscous or soluble state, to the final state—e.g. solid, hardened, or non-soluble state. In this embodiment the volume 41 is meant to correspond to a relatively low resolution.

After a step-wise repetition of changing the position of the resist relative to the radiation beam 31, a first part 410 of coarse elements is gradually formed. Specifically, this may involve a step-wise repetition of obscuring the radiation beam, changing the position, the new target volume with the radiation. The step-size, i.e. the travelled distance during a position change may correspond to a lateral nominal width of the voxel volume or may have some well-defined and predetermine relation thereto. For example, the step size may be chosen to be smaller than a lateral extension of the voxel volume so as to ensure a reliable continuity of the structure to be formed in the sense of an overlap.

Figure 9C:
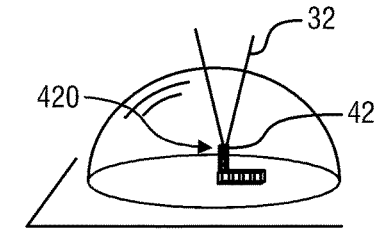

FIG. 9C shows the state after changing to a second, relatively high resolution and a step-wise repetition of changing the position of the resist relative to the radiation beam 32 by a relatively small step-size. In this way, relatively small volumes 42 are gradually added and a second part 420 of the target structure is formed that comprises a higher resolution, finer granularity and higher feature richness.

Figure 9D:
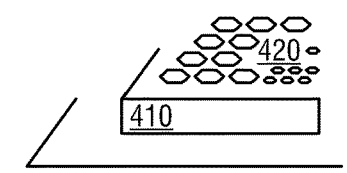

As shown in FIG. 9D, there may be obtained by the embodiments of the present invention, a target structure, such as a microchannel part, comprising a first part 410 of coarse elements, printed by means of a lower resolution, and a second part 420 of fine elements, printed by means of a higher resolution. Since the writing speed that is relative to exposed absolute volume writing can be over time by substantially reduced by forming the coarse first part means of a low resolution, the overall process time can be drastically reduced, while maintaining the fine resolution where needed (e.g. structure 420). In the shown example, one or more nano scale elements 420 may be formed by three-dimensional printing while keeping the overall process time down by printing the required, more coarse support structures 410 with a lower resolution.

FIGS. 10A and 10B show schematic views of general device and apparatus embodiments of the present invention. FIG. 10A shows schematically the configuration of a bottom-up type three-dimensional nano printer. In such a configuration, an amount of resist 20 resides under a support 60. This support 60 may be mounted on a high-resolution drive mechanism 52, such as a piezo or galvo drive. This mechanism may be controlled by respective driving controller 520. The high-resolution drive mechanism 520 may in turn be mounted on a low resolution mechanism 51, such as a piezo or step-motor drive being controlled by a respective driving controller 510. In this way, the resist 20 can be positioned relative to a beam 30 relatively fast by means of the low resolution mechanism 51 providing a relatively large step size per iteration, and, relatively slow by means of the high resolution mechanism 52 providing a relatively small step size per iteration. By means of appropriate control of the driving controllers 510 and 520 there may be formed relatively coarse structures relatively fast, while still relatively fine structures can be obtained with an increased resolution.

The setup further comprises a radiation source 70 that focusses a radiation beam 30 at a target focal point (with the corresponding effective focal point volume) inside the resist 20. For this purpose, the radiation source may comprise one or more beam sources 71, 72, that provide, respectively, radiation at a first power—and possibly with first wavelength and spectral characteristics—during exposure with a first resolution, and radiation at a second power—and possibly with second wavelength and spectral characteristics- during exposure with a second resolution. Further, the radiation source 70 may comprise an adjustable part 73 of the beam path so as to adapt the beam 30 for the chosen resolution in addition to, or instead of the plurality of beam sources 71, 72.

The shown elements can be controlled by a common controller 8 as shown schematically in FIG. 3B. This controller 8 may comprise a processing unit 81, a memory unit 82, and an interface 83. The memory unit 82 may store code that instructs the processing unit 81 during operation so as to implement a method embodiment of the present invention. Specifically, the memory unit may comprise code that implements, by means of control by the processing unit and via the interface 83 the steps setting a step size to a first resolution, setting a voxel volume to a first volume, exposing a first set of voxels of said first volume to radiation using said first resolution, setting the step size to a second resolution being smaller than said first resolution, or, respectively, greater than said first resolution, setting the voxel volume to a second volume being smaller than said first volume, or, respectively, greater than said first volume, and exposing a second set of voxels of said second volume to radiation using said second resolution. For this, the interface 83 may generate and exchange instruction commands or signals with any one of the driving controllers 510 and 520, the radiation source 70, the beam sources 71, 72, and/or the adjustable part 73 as shown in FIG. 3A.

FIGS. 11A and 11B show a schematic view of writing path arrangement according to an embodiment of the present invention. In the embodiment shown in conjunction with FIG. 11A, the writing path is adjusted starting over the whole MCP from the inside to the outside with the elements of the relatively high resolution in the center and then form the elements with the relatively low resolution in an area at least in part surrounding said center. As shown in FIG. 11B, several elements or voxels for nanometer- to micrometer-sized channels in segments over the whole MCP. In general, also alignment marks can be provided for assisting the stitching-free formation of the target structure and/or assisting and supporting a change of resolution.

Although detailed embodiments have been described, these only serve to provide a better understanding of the invention defined by the independent claims and are not to be seen as limiting.

The invention claimed is:

1. A microchannel sensor for detecting radiation and/or particles, the microchannel sensor comprising at least one sensor substrate, wherein said sensor substrate comprises a plurality of channels extending from a first side of the substrate to an opposite side of the substrate, wherein said channels are arranged along a channel axis which is tilted relative a normal axis of said substrate, and wherein said plurality of channels comprise a first set of channels with a first overall cross section size and a second set of channels with a second overall cross section size being different from said first overall cross section size,
   wherein at least one channel of the plurality of channels narrows between the first side of the substrate and the opposite side of the substrate.

2. The microchannel sensor according to claim 1, further comprising a first electrode and a second electrode, said sensor substrate being arranged between said first electrode and said second electrode, and wherein said channels extend from a side facing said first electrode to a side facing said second electrode.

3. The microchannel sensor according to claim 1, wherein any one of said cross sections each comprise a hollow channel part and a solid wall part surrounding said hollow channel part.

4. The microchannel sensor according to claim 3, wherein the hollow channel parts of said first overall cross section size is identical to, or within a specified tolerance of the hollow channel parts of said second overall cross section size.

5. The microchannel sensor according to claim 4, wherein a channel density decreases with increasing distance from a center of said sensor substrate.

6. The microchannel sensor according to claim 3, wherein at least the hollow channel part of a cross section has a circular shape with point symmetry.

7. The microchannel sensor according to claim 3, wherein at least the hollow channel part of a cross section has a shape with only four, three or two symmetry axes.

8. The microchannel sensor according to claim 3, wherein a diameter of at least the hollow channel part of a cross section does not exceed 20 micrometers.

9. The microchannel sensor according to claim 3, wherein a diameter of at least the hollow channel part of a cross section does not exceed 10 micrometers.

10. The microchannel sensor according to claim 3, wherein a diameter of at least the hollow channel part of a cross section does not exceed 100 nanometers.

11. The microchannel sensor according to claim 1, wherein the first set of channels is arranged in a first zone of a substrate surface, and the second set of channels is arranged in a second zone of the substrate surface being different from said first zone.

12. The microchannel sensor according to claim 1, wherein the first and second set of channels are arranged in an active zone of said sensor substrate, and wherein a support structure is provided as part of said substrate surrounding at least in part said active zone.

13. The microchannel sensor according to claim 1, wherein the sensor substrate comprises one or more channel zones and a support part that surrounds at least in part said one or more channel zones.

14. The microchannel sensor according to claim 13, wherein the sensor substrate in said one or more channel zones comprises a higher density of channels than in said support part.

* * * * *